United States Patent
Cho et al.

(10) Patent No.: US 8,211,757 B2
(45) Date of Patent: Jul. 3, 2012

(54) ORGANIC THIN FILM TRANSISTOR SUBSTRATE AND FABRICATION METHOD THEREFOR

(75) Inventors: Seung Hwan Cho, Hwaseong-si (KR); Bo Sung Kim, Seoul (KR); Keun Kyu Song, Yongin-si (KR)

(73) Assignee: Samsung Electronics Co., Ltd. (KR)

(*) Notice: Subject to any disclaimer, the term of this patent is extended or adjusted under 35 U.S.C. 154(b) by 4 days.

(21) Appl. No.: 12/871,642

(22) Filed: Aug. 30, 2010

(65) Prior Publication Data

US 2011/0053315 A1    Mar. 3, 2011

Related U.S. Application Data

(62) Division of application No. 11/766,597, filed on Jun. 21, 2007, now Pat. No. 7,803,669.

(30) Foreign Application Priority Data

Jun. 28, 2006 (KR) .................. 10-2006-0058697

(51) Int. Cl.
  *H01L 21/00* (2006.01)
(52) U.S. Cl. .............. 438/149; 438/99; 438/30; 438/82; 438/148; 257/40; 257/42; 257/43; 257/E49.001
(58) Field of Classification Search .............. 438/99, 438/148, 82, 30, 939, 149; 257/E51.006, 257/40, 77, 42–43, 613–616, E49.001
See application file for complete search history.

(56) References Cited

U.S. PATENT DOCUMENTS

| | | | |
|---|---|---|---|
| 5,365,090 A | 11/1994 | Taka et al. | |
| 5,596,208 A | 1/1997 | Dodabalapur et al. | |
| 5,656,824 A | 8/1997 | den Boer et al. | |
| 5,742,129 A * | 4/1998 | Nagayama et al. | 315/167 |
| 5,759,906 A * | 6/1998 | Lou | 438/623 |
| 5,805,252 A * | 9/1998 | Shimada et al. | 349/113 |
| 5,828,082 A | 10/1998 | Wu | |
| 5,854,663 A * | 12/1998 | Oh et al. | 349/42 |
| 6,060,333 A * | 5/2000 | Tanaka et al. | 438/30 |
| 6,118,506 A | 9/2000 | Yamazaki et al. | |
| 6,274,516 B1 | 8/2001 | Kamei et al. | |
| 6,300,988 B1 * | 10/2001 | Ishihara et al. | 349/43 |
| 6,424,401 B1 * | 7/2002 | Kang et al. | 349/153 |
| 6,545,424 B2 | 4/2003 | Ozawa | |
| 6,635,508 B2 | 10/2003 | Arai et al. | |
| 6,674,495 B1 * | 1/2004 | Hong et al. | 349/43 |
| 6,747,718 B2 * | 6/2004 | Kanou et al. | 349/113 |

(Continued)

FOREIGN PATENT DOCUMENTS

JP    2003337353 A    11/2003

(Continued)

*Primary Examiner* — N Drew Richards
*Assistant Examiner* — Ankush Singal
(74) *Attorney, Agent, or Firm* — Innovation Counsel LLP

(57) ABSTRACT

An organic thin film transistor substrate includes a gate line formed on a substrate, a data line intersecting the gate line and defining a subpixel area, an organic thin film transistor including a gate electrode connected to the gate line, a source electrode connected to the data line, a drain electrode facing the source electrode, and an organic semiconductor layer forming a channel between the source and drain electrodes, a passivation layer parallel with the gate line, for covering the organic semiconductor layer and peripheral regions of the organic semiconductor layer, and a bank insulating layer for determining the position of the organic semiconductor layer and the passivation layer.

9 Claims, 12 Drawing Sheets

U.S. PATENT DOCUMENTS

| | | |
|---|---|---|
| 6,853,405 B2 | 2/2005 | Lee |
| 6,859,254 B2 | 2/2005 | Kim et al. |
| 6,872,980 B2 | 3/2005 | Cheng et al. |
| 6,885,146 B2 * | 4/2005 | Yamazaki et al. ............ 313/498 |
| 6,919,945 B2 * | 7/2005 | Ha ................................ 349/114 |
| 6,992,324 B2 | 1/2006 | Nagayama |
| 7,026,644 B2 * | 4/2006 | Cheng et al. .................... 257/40 |
| 7,199,516 B2 | 4/2007 | Seo et al. |
| 7,208,756 B2 | 4/2007 | Shih et al. |
| 7,223,999 B2 | 5/2007 | Jang et al. |
| 7,274,420 B2 | 9/2007 | You |
| 7,277,148 B2 | 10/2007 | Kim et al. |
| 7,307,381 B2 * | 12/2007 | Ito et al. ........................ 313/506 |
| 7,316,784 B2 * | 1/2008 | Ahn et al. ........................ 216/23 |
| 7,342,247 B2 * | 3/2008 | Lee et al. .......................... 257/40 |
| 7,378,791 B2 | 5/2008 | Yamazaki et al. |
| 7,381,984 B2 | 6/2008 | Suh et al. |
| 7,449,351 B2 | 11/2008 | Yamada |
| 7,456,912 B2 * | 11/2008 | Wong et al. ...................... 349/43 |
| 7,489,379 B2 | 2/2009 | Ahn et al. |
| 7,527,992 B2 * | 5/2009 | Lee et al. .......................... 438/29 |
| 7,554,113 B2 | 6/2009 | Arai et al. |
| 7,626,196 B2 | 12/2009 | Hirakata et al. |
| 7,859,639 B2 * | 12/2010 | Ahn ................................ 349/187 |
| 7,985,967 B2 * | 7/2011 | Hirakata et al. ................ 257/40 |
| 2001/0007362 A1 * | 7/2001 | Ha et al. ......................... 257/154 |
| 2001/0019375 A1 * | 9/2001 | Kwon et al. ...................... 349/43 |
| 2002/0011783 A1 | 1/2002 | Hosokawa |
| 2002/0022299 A1 | 2/2002 | Jackson |
| 2002/0037646 A1 * | 3/2002 | Lyu ................................ 438/689 |
| 2002/0075424 A1 | 6/2002 | Sakamoto et al. |
| 2002/0113248 A1 | 8/2002 | Yamagata et al. |
| 2002/0179901 A1 * | 12/2002 | Arai et al. ........................ 257/40 |
| 2002/0182845 A1 * | 12/2002 | Miyano et al. ................. 438/618 |
| 2003/0038907 A1 | 2/2003 | Ikeno et al. |
| 2003/0076286 A1 * | 4/2003 | Luo et al. .......................... 345/87 |
| 2003/0107314 A1 * | 6/2003 | Urabe et al. ................... 313/506 |
| 2003/0123015 A1 * | 7/2003 | Park ................................ 349/149 |
| 2003/0133059 A1 | 7/2003 | Wei et al. |
| 2003/0146693 A1 * | 8/2003 | Ishihara et al. ................ 313/504 |
| 2003/0203643 A1 * | 10/2003 | Hasei et al. .................... 438/758 |
| 2004/0001172 A1 | 1/2004 | Tanaka et al. |
| 2004/0023447 A1 | 2/2004 | Hirakata et al. |
| 2004/0109110 A1 * | 6/2004 | Kim et al. ...................... 349/106 |
| 2004/0126917 A1 * | 7/2004 | Yoo et al. ......................... 438/30 |
| 2004/0150761 A1 * | 8/2004 | Wong et al. ...................... 349/43 |
| 2004/0195571 A1 * | 10/2004 | Ahn et al. ......................... 257/72 |
| 2004/0239838 A1 * | 12/2004 | Lai ................................. 349/106 |
| 2005/0001967 A1 * | 1/2005 | Chae et al. ..................... 349/139 |
| 2005/0062040 A1 | 3/2005 | Wong et al. |
| 2005/0110008 A1 * | 5/2005 | Koo et al. ......................... 257/40 |
| 2005/0167703 A1 | 8/2005 | Klauk et al. |
| 2005/0170564 A1 * | 8/2005 | Lai ................................. 438/149 |
| 2005/0176185 A1 * | 8/2005 | Jang et al. ...................... 438/155 |
| 2005/0189876 A1 | 9/2005 | Yamazaki et al. |
| 2005/0230684 A1 | 10/2005 | Seo et al. |
| 2005/0263762 A1 * | 12/2005 | Kim ................................ 257/66 |
| 2005/0264182 A1 | 12/2005 | Seki |
| 2005/0285102 A1 * | 12/2005 | Koo et al. ......................... 257/40 |
| 2006/0060939 A1 | 3/2006 | Seto et al. |
| 2006/0102897 A1 * | 5/2006 | Suh et al. ......................... 257/40 |
| 2006/0108587 A1 * | 5/2006 | Lee et al. .......................... 257/72 |
| 2006/0127563 A1 * | 6/2006 | Toyoda et al. ................... 427/58 |
| 2006/0131573 A1 | 6/2006 | Arai et al. |
| 2006/0138941 A1 | 6/2006 | Wittmann |
| 2006/0152663 A1 * | 7/2006 | Kamoshida et al. .......... 349/149 |
| 2006/0273712 A1 | 12/2006 | Yaegashi |
| 2007/0018161 A1 * | 1/2007 | Song et al. ...................... 257/59 |
| 2007/0024181 A1 * | 2/2007 | Oh ................................. 313/500 |
| 2007/0069204 A1 | 3/2007 | Jang et al. |
| 2007/0085939 A1 * | 4/2007 | You ................................ 349/43 |
| 2007/0114524 A1 | 5/2007 | Oh et al. |
| 2007/0165180 A1 * | 7/2007 | Cho ................................ 349/187 |
| 2008/0012008 A1 | 1/2008 | Song et al. |
| 2008/0012011 A1 | 1/2008 | Song et al. |
| 2008/0017851 A1 | 1/2008 | Choi et al. |
| 2008/0023695 A1 | 1/2008 | Cho et al. |
| 2008/0023697 A1 | 1/2008 | Cho et al. |
| 2008/0087880 A1 | 4/2008 | Nomura et al. |
| 2008/0158209 A1 | 7/2008 | Ozawa |
| 2008/0265293 A1 | 10/2008 | Lee et al. |
| 2008/0266508 A1 * | 10/2008 | Kim ................................ 349/152 |

FOREIGN PATENT DOCUMENTS

| | | |
|---|---|---|
| JP | 2004146388 A | 5/2004 |
| KR | 1020050023012 A | 3/2005 |

* cited by examiner

US 8,211,757 B2

ORGANIC THIN FILM TRANSISTOR SUBSTRATE AND FABRICATION METHOD THEREFOR

CROSS-REFERENCE TO RELATED APPLICATIONS

The present application is a divisional of, and claims benefit of U.S. Ser. No. 11/766,597 filed Jun. 21, 2007, now U.S. Pat. No. 7,803,669, where the latter claims priority of Korean Patent Application No. 10-2006-0058697, filed on Jun. 28, 2006, where the disclosures of said US and said Korean applications are incorporated herein by reference in their entireties.

BACKGROUND

1. Field of Disclosure

The present disclosure of invention relates to a thin film transistor substrate and a fabrication method therefor, and more particularly, to an organic thin film transistor substrate capable of simplifying a process and improving picture quality, and a fabrication method therefor.

2. Description of the Related Art

A liquid crystal display (LCD) device displays images by controlling the light transmittance of liquid crystals having dielectric anisotropy using an electric field. The LCD device includes an LCD panel for displaying images through a liquid crystal cell matrix and driving circuits for driving the LCD panel.

The LCD device displays images by causing each of liquid crystal cells arranged in a matrix form in the LCD panel to control the light transmittance according to a video signal.

A thin film transistor (TFT) is used as a switching element for independently supplying the video signal to each of the liquid crystal cells. Amorphous silicon or polycrystalline silicon is used as an active layer of such TFT.

However, since the amorphous silicon or polycrystalline silicon active layer is patterned through a thin film depositing (or coating) process, a photolithography process and an etching process, the fabricating process becomes complicated and expensive. Therefore, it has been proposed to form organic TFT using an organic semiconductor layer which can be formed through a printing process.

The organic semiconductor layer of the organic TFT is protected by a passivation layer formed within a hole provided by a bank insulating layer. However, because the passivation layer differs in thickness between the edge and center within the hole the passivation layer looks like a stain. In addition, moisture and chemical liquid permeate into the boundary between the passivation layer and the organic semiconductor layer, thereby damaging the organic semiconductor layer. Moreover, in a conventional organic TFT substrate, since a bank insulating layer having a hole filled with the passivation layer and a bank insulating layer having a hole filled with the organic semiconductor layer are formed by separate mask processes, a fabricating process is complicated.

SUMMARY

In accordance with an aspect of the present disclosure of invention a TFT substrate, comprises a gate line formed on a substrate, a data line intersecting the gate line and defining a subpixel area, an organic TFT including a gate electrode connected to the gate line, a source electrode connected to the data line, a drain electrode facing the source electrode, and an organic semiconductor layer forming a channel between the source and drain electrodes, a passivation layer parallel with the gate line for covering the organic semiconductor layer and peripheral regions of the organic semiconductor layer, and a bank insulating layer determining the position of the organic semiconductor layer and the passivation layer.

The bank insulating layer includes a first bank insulating layer providing a dot hole filled with the organic semiconductor layer in each subpixel, and a second bank insulating layer providing a line hole connected to the dot hole of each subpixel and filled with the passivation layer.

The dot hole is filled with a gate insulating layer located between the gate electrode and the organic semiconductor layer.

The source and drain electrodes and the data line are formed in a double layer structure including a transparent conductive layer, and the pixel electrode is formed by extending the transparent conductive layer of the drain electrode.

The gate electrode and the gate line are formed in at least a double layer structure including a transparent conductive layer, and the pixel electrode is formed of the transparent conductive layer on the same plane as the gate electrode and the gate line.

In accordance with another aspect of the present invention, a TFT substrate can be fabricated by forming a gate line and a gate electrode connected to the gate line on a substrate, forming a stepped bank insulating layer exposing the gate electrode, forming an organic gate insulating layer to cover the exposed gate electrode within the bank insulating layer, forming on the bank insulating layer a data line intersecting the gate line, a source electrode connected to the data line, a drain electrode facing the source electrode, and a pixel electrode connected to the drain electrode, forming an organic semiconductor layer forming a channel between the source and drain electrodes within the bank insulating layer, and forming a passivation layer to cover the organic semiconductor layer and peripheral regions of the organic semiconductor layer within the bank insulating layer.

The forming of the bank insulating layer includes forming a first bank insulating layer for providing a dot hole filled with the organic semiconductor layer in each subpixel area, and forming a second bank insulating layer for providing a line hole connected to the dot hole of each subpixel region and filled with the passivation layer.

The forming of the bank insulating layer includes forming an organic insulating material on a substrate on which the gate electrode and the gate line are formed, forming photoresist patterns having a different thickness by a photolithography process using a half-tone mask or a slit mask on the organic insulating material, and forming a first bank insulating layer having a first thickness and a second bank insulating layer having a second thickness by an etching process using the photoresist patterns.

The forming of the data line, the source electrode, the drain electrode and the pixel electrode includes sequentially forming a transparent conductive layer and a source/drain metal layer on the substrate, forming photoresist patterns having a different thickness on the source/drain metal layer, forming a source/drain metal pattern including the data line and the source and drain electrodes on the first bank insulating layer and forming the pixel electrode on the second bank insulating layer, by patterning the source/drain metal layer and the transparent conductive layer using the photoresist patterns, exposing the source/drain metal layer of the pixel electrode by ashing the photoresist patterns, and removing the exposed source/drain metal layer.

The method further comprises surface-processing the gate electrode before forming the organic gate insulating layer so that the gate electrode can exhibit hydrophilicity with the organic gate insulating layer.

The method further comprises surface-processing the organic gate insulating layer before forming the organic semiconductor layer so that the organic gate insulating layer can have hydrophilicity with the organic semiconductor layer.

The method further comprises surface-processing the bank insulating layer before forming the passivation layer so that the bank insulating layer can have hydrophilicity with the passivation layer.

BRIEF DESCRIPTION OF THE DRAWINGS

The above and other features and advantages of the present invention will become more apparent from the following detailed description when taken in conjunction with the accompanying drawings, in which.

DETAILED DESCRIPTION OF THE EXEMPLARY EMBODIMENTS

The exemplary embodiments of the present invention will now be described with reference to the attached drawings.

Figure 1:
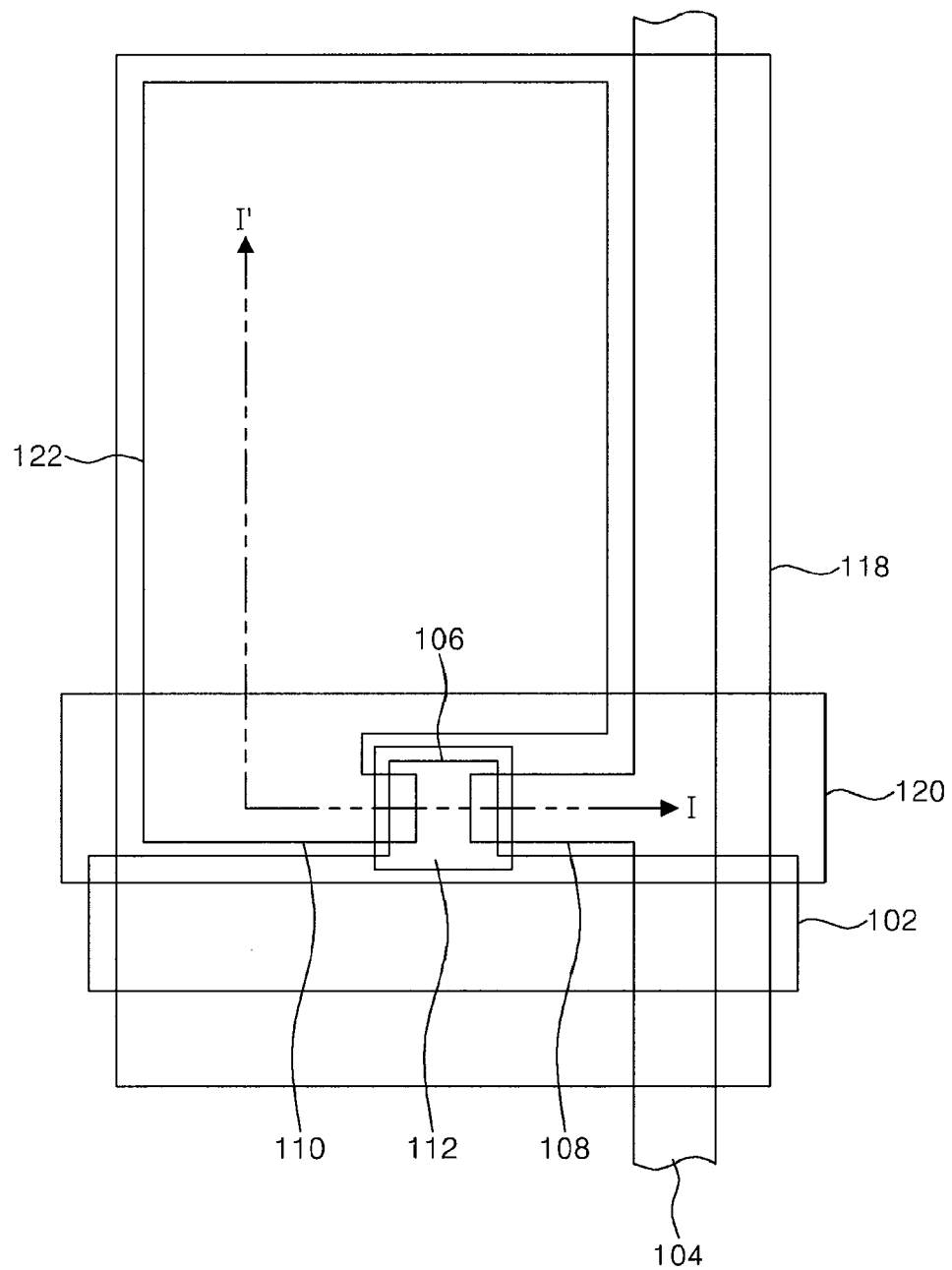
FIG. 1 is a plane view illustrating an organic TFT substrate according to an exemplary embodiment of the present invention.
Figure 2:
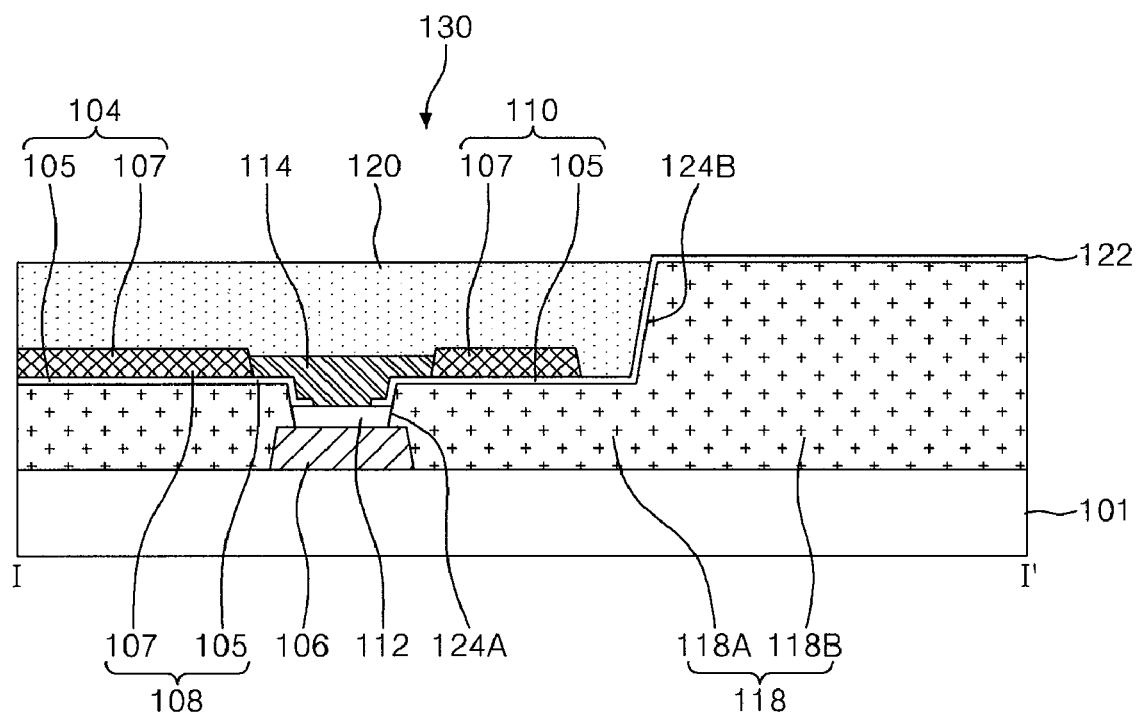
FIG. 2 is a cross-sectional view taken along the line I-I' of the organic TFT substrate of FIG. 1.

FIG. 1 is a plane view illustrating an organic TFT substrate according to an exemplary embodiment of the present invention, and FIG. 2 is a cross-sectional view taken along the line I-I' of the organic TFT substrate of FIG. 1.

The organic TFT substrate illustrated in FIGS. 1 and 2 includes a lower substrate 101 having a gate line 102 and a data line 104 that intersect each other with a bank insulating layer 118 interposed therebetween. A TFT 130 is connected at the intersection of the gate line 102 and the data line 104, and a pixel electrode 122 is formed in a subpixel area provided by the intersection structure and is connected to the TFT 130.

The gate line 102 receives a scan signal from a gate driver (not shown), and the data line 104 receives a pixel signal from a data driver (not shown). A pixel is defined at the intersection of a gate line 102 and a data line 104. A bank-insulating layer 108 is interposed between the gate line and data line.

The data line 104 may be formed in a multi-layer structure including a transparent conductive layer on the bank-insulating layer 118. For example, the data line 104 is formed of a first conductive layer 105 using a transparent conductive layer and a second conductive layer 107 using an opaque metal. The first conductive layer 105 may use indium tin oxide (ITO), tin oxide (TO), indium zinc oxide (IZO), indium tin zinc oxide (ITZO), etc. and the second conductive layer 107 may use cupper (Cu), molybdenum (Mo), aluminum (Al), Cu alloy, Mo alloy, Al alloy, etc.

The TFT 130 causes the pixel signal supplied from the data line 104 to be charged and maintained on the pixel electrode 122 in response to the scan signal supplied from the gate line 102. The TFT 130 includes a gate electrode 106 connected to the gate line 102, a source electrode 108 connected to the data line 104, a drain electrode 110 which faces the source electrode 108 and is connected to the pixel electrode 122, and an organic semiconductor layer 114 forming a channel between the source electrode 108 and the drain electrode 110 by overlapping the gate electrode 106 with an organic gate insulating layer 112 interposed therebetween.

The gate electrode 106 is exposed by a dot hole 124A provided in the first bank insulating layer 118A. Each of the source and drain electrodes 108 and 110 is formed by depositing the first and second conductive layers 105 and 107 in the same manner as data line 104. The organic semiconductor layer 114 is formed within the dot hole 124A provided by the source and drain electrodes 108 and 110 and the first bank insulating layer 118A in a region overlapping the gate electrode 106. The organic semiconductor layer 114 is formed of an organic semiconductor material, such as pentacene, tetracene, anthracene, naphthalene, $\alpha$-6T, $\alpha$-4T, perylene, and their derivatives; rubrene and its derivatives; coronene and its derivatives; perylene tetracarboxylic diimide and its derivatives; perylenetetracarboxylic dianhydride and its derivatives; phthalocyanine and its derivatives; naphthalene tetracarboxylic diimide and its derivatives; naphthalene tetracarboxylic dianhydride and its derivatives; conjugated system high polymer derivatives including substituted or nonsubstituted thiophene; and conjugated system high polymer derivatives including substituted fluorine.

The organic semiconductor layer 114 may be in ohmic-contact with the source and drain electrodes 108 and 110 through a self-assembled monolayer (SAM) process. Specifically, through the SAM process, the difference in work functions between each of the source and drain electrodes 108 and 110 and the organic semiconductor layer 114 is reduced. Therefore, hole injection into the organic semiconductor layer 114 from each of the source and drain electrodes 108 and 110 is facilitated and the contact resistance between each of the source and drain electrodes 108 and 110 and the organic semiconductor layer 114 is reduced.

The TFT 130 is protected by an organic passivation layer 120. The organic passivation layer 120 is formed substantially parallel with the gate line 102 within a line hole 124B provided in a second bank insulating layer 118B. The organic passivation layer 120 formed within the line hole 124B covers not only the TFT 130 but also peripheral regions of the TFT 130. Especially, the organic passivation layer 120 covers the boundary between each of the source and drain electrodes 108 and 110 and the organic semiconductor layer 114. Therefore, damage to the organic semiconductor layer 114 caused by moisture permeating into the boundary between each of the source and drain electrodes 108 and 110 and the organic semiconductor layer 114 or by chemicals used in the process is prevented. In addition, the organic passivation layer 120 formed within the line hole 124B has the wide process margin of an ink-jet device compared to a conventional organic passivation layer formed on a dot basis, thereby simplifying the process.

The bank insulating layer 118 is formed with stepped coverage to provide the dot hole 124A and the line hole 124B. Namely, the bank insulating layer 118 includes the first bank insulating layer 118A for providing the dot hole 124A in each subpixel area on the lower substrate 101 and the second bank insulating layer 118B thicker than the first bank insulating layer 118A, for providing the line hole 124B. The first bank insulating layer 118A is surrounded by the second bank insulating layer 118B and the first and second bank insulating layers 118A and 118B are unitedly formed. The line hole 124B is formed in parallel with the gate line 102 so that it can be connected to the dot hole 124A of each subpixel area.

The pixel electrode 122 is formed by extending the first conductive layer 105, which is a transparent conductive layer of the drain electrode 110, on the bank-insulating layer 118 of each subpixel area. If the gate electrode 106 and the gate line 102 may be formed in a double layer structure including a transparent conductive layer, the pixel electrode 122 may be formed of the transparent conductive layer on the same plane as the gate electrode 106 and the gate line 102.

If a video signal is supplied through the TFT 130, the pixel electrode 122 forms an electric field together with a common electrode to which a common voltage is supplied. As a result, liquid crystal molecules between the TFT substrate and the color filter substrate are rotated because of their dielectric anisotropy. The light transmittance of the pixel varies according to the degree of rotation of the liquid crystal molecules, thereby achieving a gray scale.

Figure 3A:
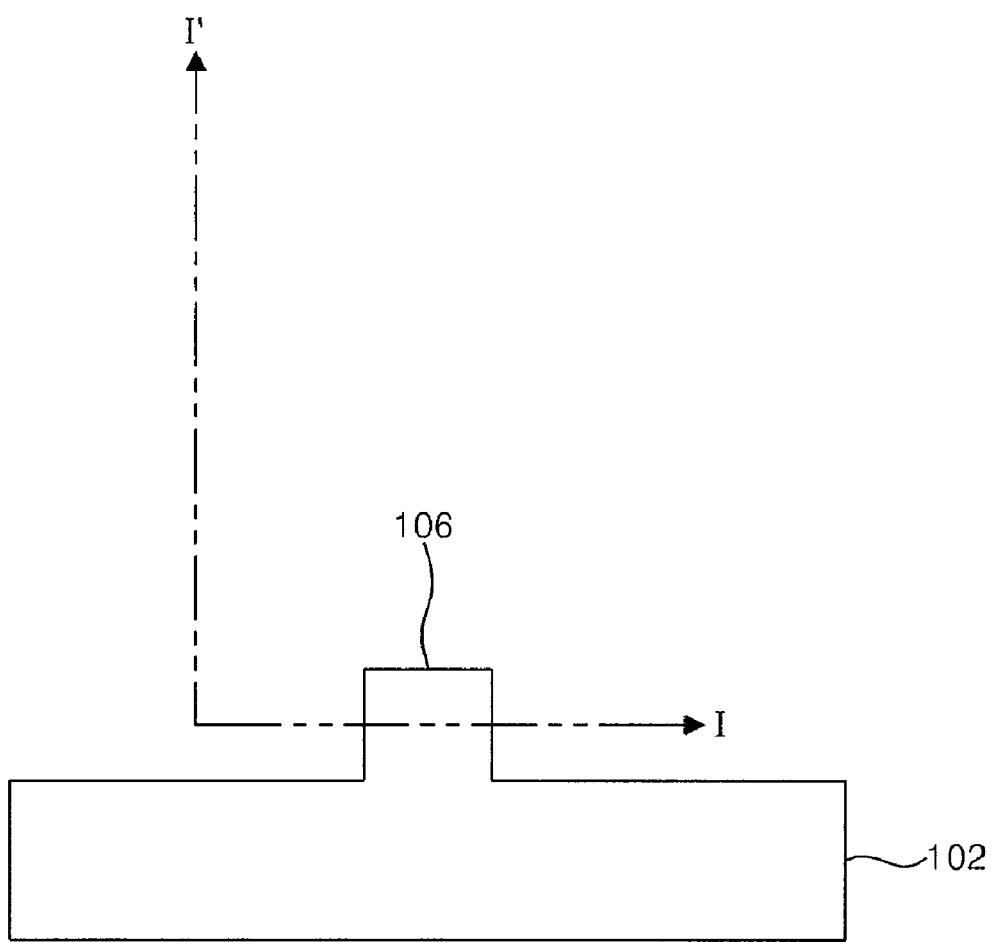
FIGS. 3A and 3B are a plane view and a cross-sectional view, respectively, for explaining a process of fabricating a gate metal pattern illustrated in FIGS. 1 and 2.
Figure 3B:
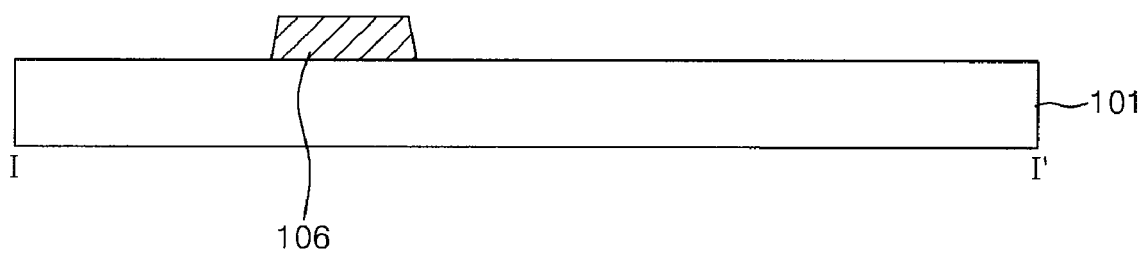

FIGS. 3A and 3B are a plane view and a cross-sectional view, respectively, for explaining a process of fabricating a gate metal pattern out of a process of fabricating the TFT substrate according to the present invention.

As shown in FIGS. 3A and 3B, a gate metal pattern including the gate line 102 and the gate electrode 106 is formed on the lower substrate 101 by a first mask process.

Specifically, a gate metal layer is deposited on the lower substrate 101 and then the gate metal layer is patterned by a photolithography process and an etching process. The gate metal pattern includes the gate line 102 and the gate electrode 106. The gate metal layer is formed in a single layer structure of a metal material such as molybdenum (Mo), titanium (Ti), copper (Cu), aluminum neodymium (AlNd), aluminum (Al), chrome (Cr), Mo alloy, Cu alloy and Al alloy, or in a multi-layer structure deposited by a double layer or more layers using these metals.

Figure 4A:
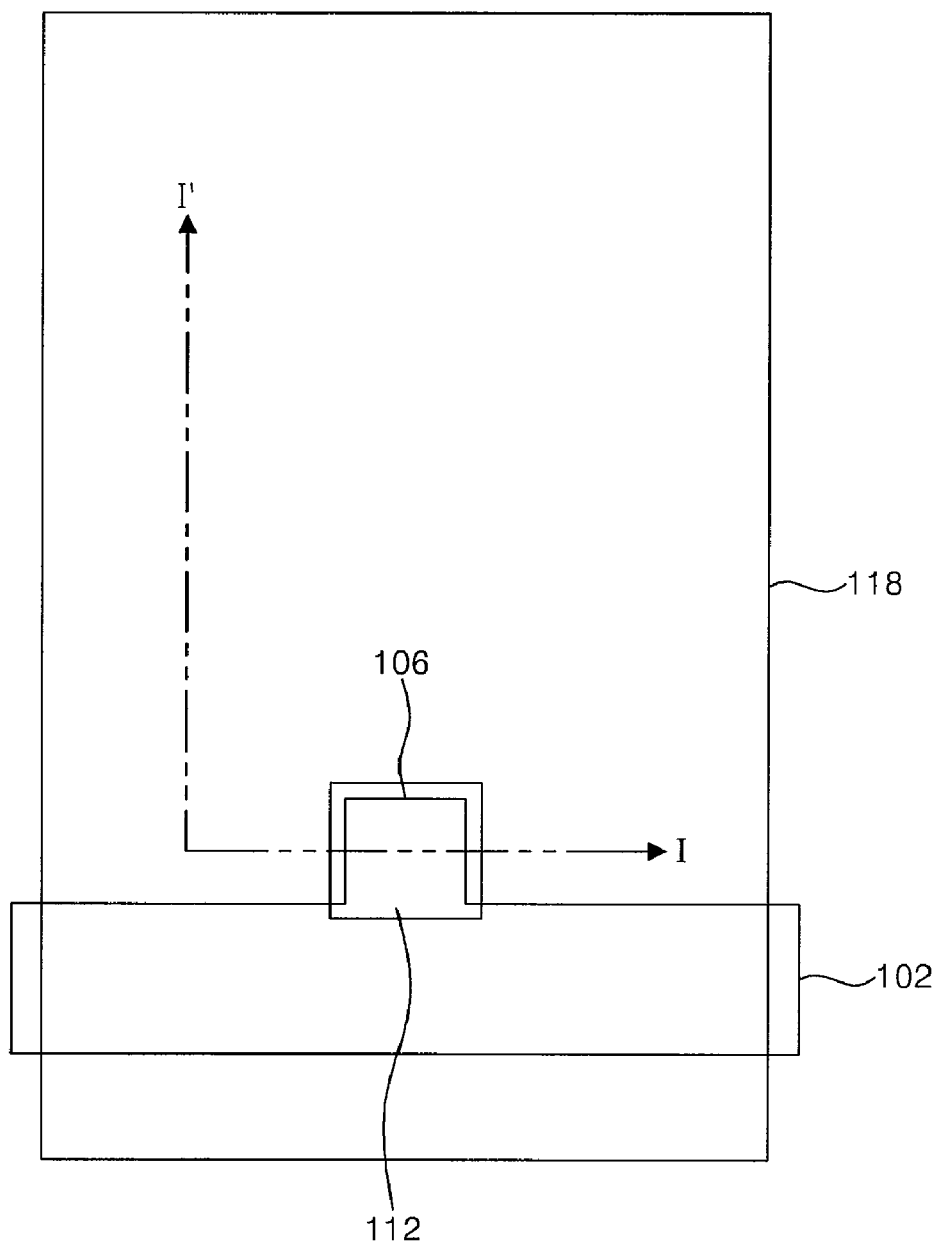
FIGS. 4A and 4B are a plane view and a cross-sectional view, respectively, for explaining a process of fabricating a bank insulating layer and an organic gate insulating layer illustrated in FIGS. 1 and 2.
Figure 4B:
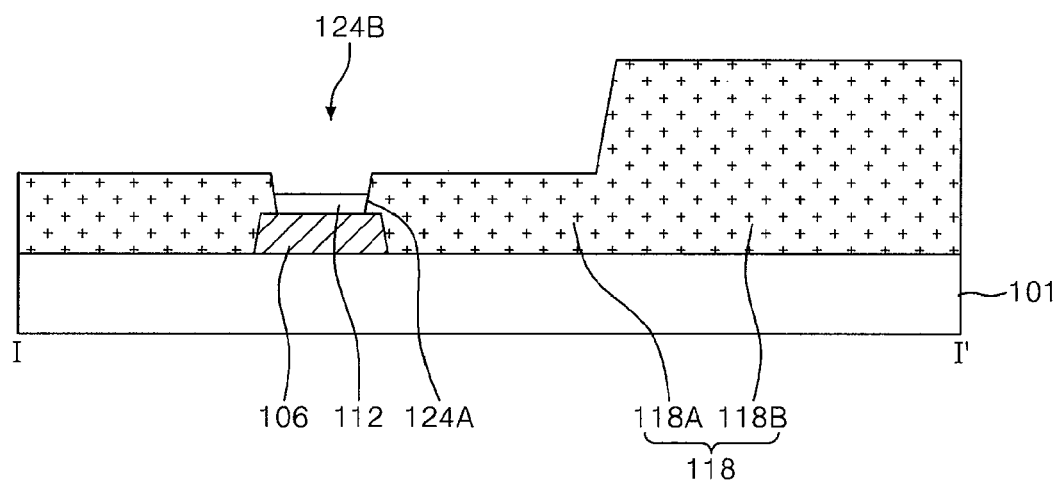

FIGS. 4A and 4B are a plane view and a cross-sectional view, respectively, for explaining the process of fabricating the bank-insulating layer 118 and the organic gate-insulating layer 112 within the process of fabricating the TFT substrate according to the present invention.

As shown in FIGS. 4A and 4B, the first bank insulating layer 118A having the dot hole 124A and the second bank insulating layer 118B having the line hole 124B are formed on the lower substrate 101 on which the gate metal pattern group is formed. The organic gate insulating layer 112 is formed within the dot hole 124A provided by the first bank insulating layer 118A. This will be described in detail with reference to FIGS. 5A to 5C.

Figure 5A:
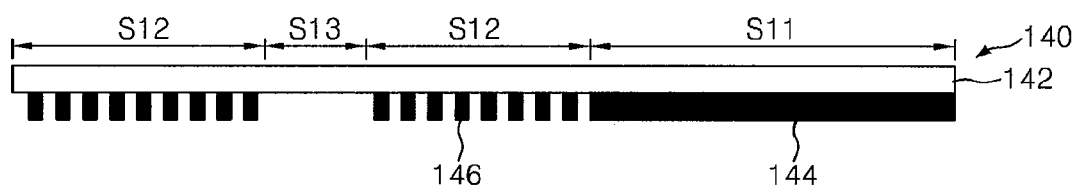
FIGS. 5A to 5C are cross-sectional views for explaining in detail a process of fabricating the bank insulating layer and the organic gate insulating layer illustrated in FIG. 4B.
Figure 5A:
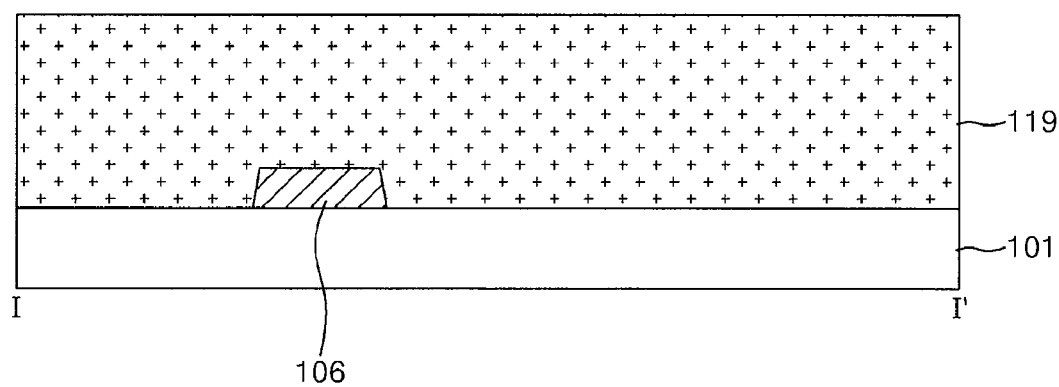

As illustrated in FIG. 5A, a photosensitive organic insulating material 119 is deposited by a spinless or spin coating method on the whole surface of the lower substrate 101 on which the gate pattern group is formed. Thereafter, a slit mask 140 is arranged on the lower substrate 101. The slit mask 140 includes an opaque region S11 in which an opaque layer 144 is formed on a quartz substrate 142, a slit region S12 in which a plurality of slits 146 is formed on the quartz substrate 142, and a transmission region S13 in which only the quartz substrate 142 exists.

Figure 5B:
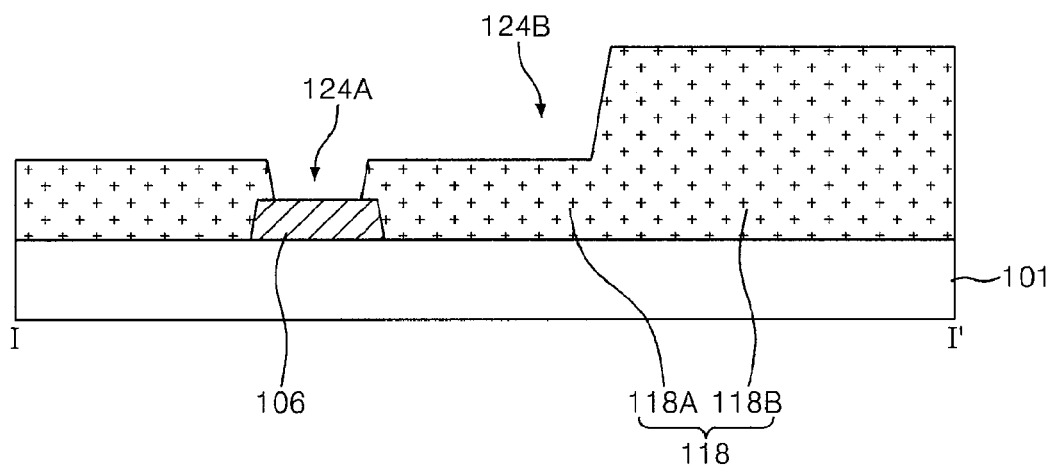

The opaque region S11 cuts off ultraviolet rays during the exposure process. Then, after the development process, the second bank insulating layer 118B is formed on the lower substrate 101 of a region corresponding to the opaque region S11, as illustrated in FIG. 5B. The slit region S12 diffracts ultraviolet rays during the exposure process. Then, after the development process, the first bank insulating layer 118A which is thinner than the second bank insulating layer 118B is formed on the lower substrate 101 of a region corresponding to the slit region S12. At the same time, the line hole 124B is formed parallel with the gate line 102, as illustrated in FIG. 5B.

Figure 5C:
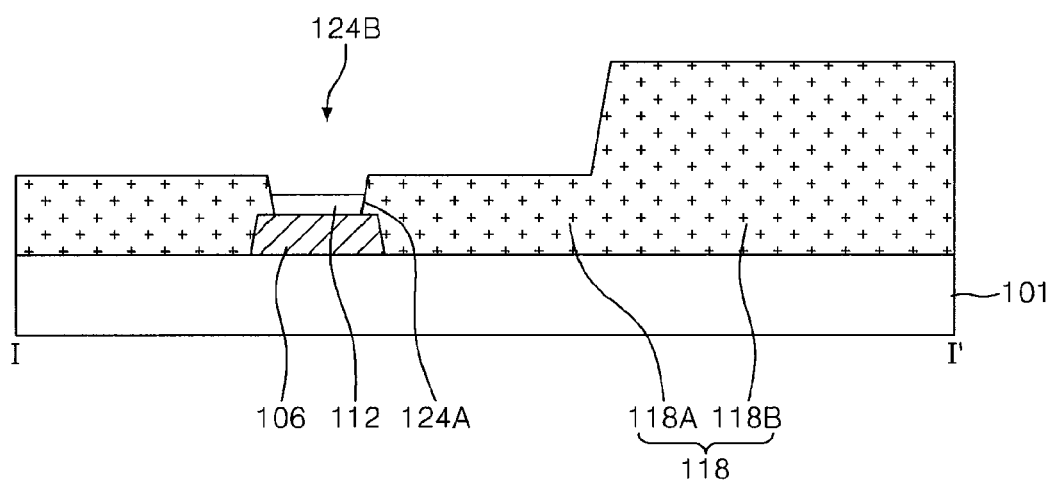

The transmission region S13 transmits ultraviolet rays during the exposure process. Then after the development process, the dot hole 124A overlapping the line hole 124B is formed on the lower substrate 101 of a region corresponding to the transmission region S13, as illustrated in FIG. 5B. The dot hole 124A exposes the gate electrode 106. Thereafter, an organic insulating liquid is jetted into the dot hole 124A by using an ink-jet device and then hardened, thereby forming the organic gate insulating layer 112 filled in the dot hole 124A as illustrated in FIG. 5C. The organic gate insulating layer 112 uses polyvinyl pyrrolidone (PVP), polymethylmethacrylate (PMMA), benzocyclobutene (BCB), polyimide, polyvinylphenol, parylene, etc.

The lower substrate 101 on which the bank insulating layer 118 is formed may be surface-processed before the organic insulating liquid is jetted. Through the surface process, the gate electrode 106 exposed by the bank insulating layer 118 has hydrophilicity with the organic insulating liquid and the bank insulating layer 118 has hydrophobicity with the organic insulating liquid. Next, if the organic insulating liquid is jetted onto the lower substrate 101, it is concentrated on the gate electrode 106 having hydrophilicity with the organic insulating liquid, thereby forming the organic gate insulating layer 112. The organic gate insulating layer 112 is prevented from overflowing into regions except the interior of the dot hole 124A through the surface process.

Figure 6A:
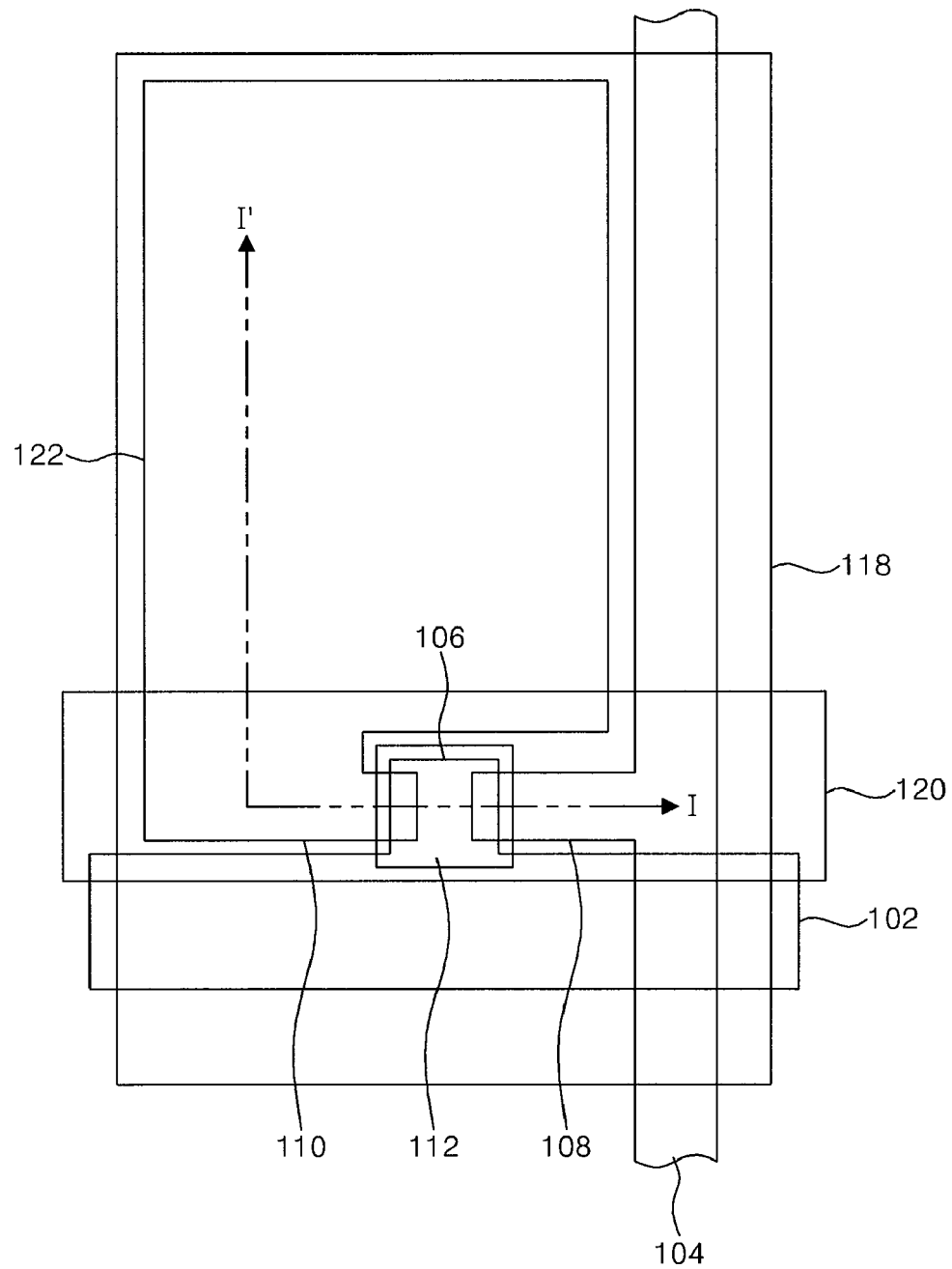
FIGS. 6A and 6B are a plane view and a cross-sectional view, respectively, for explaining a process of fabricating of a source/drain metal pattern, a pixel electrode, an organic semiconductor layer and a passivation layer illustrated in FIGS. 1 and 2.
Figure 6B:
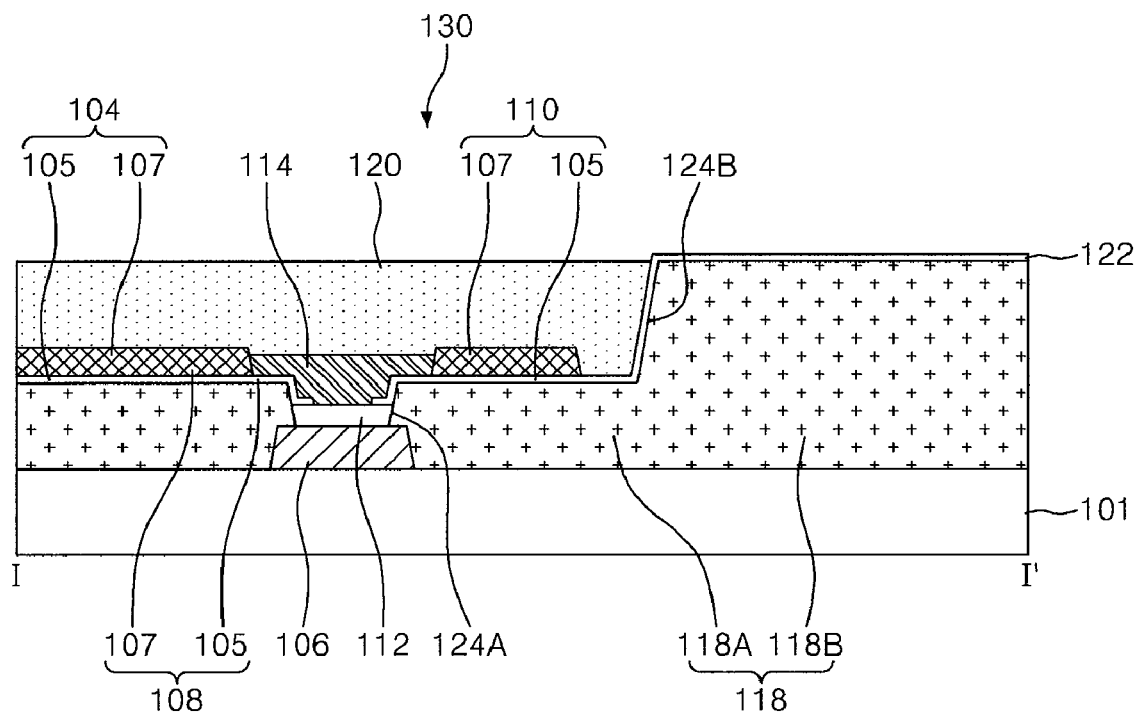

FIGS. 6A and 6B are a plane view and a cross-sectional view, respectively, for explaining a process of fabricating a source/drain metal pattern, the pixel electrode 122, the organic semiconductor layer 114 and the organic passivation layer 120 out of a process of fabricating the TFT substrate according to the present invention.

As shown in FIGS. 6A and 6B, a source/drain metal pattern including the data line 104, the source electrode 108 and the drain electrode 110, and the pixel electrode 122 is formed on the lower substrate 101 on which the organic gate insulating layer 112 is formed. Thereafter, the organic semiconductor layer 114 and the organic passivation layer 120 are sequentially deposited. This will be described in detail with reference to FIGS. 7A to 7D.

Figure 7A:
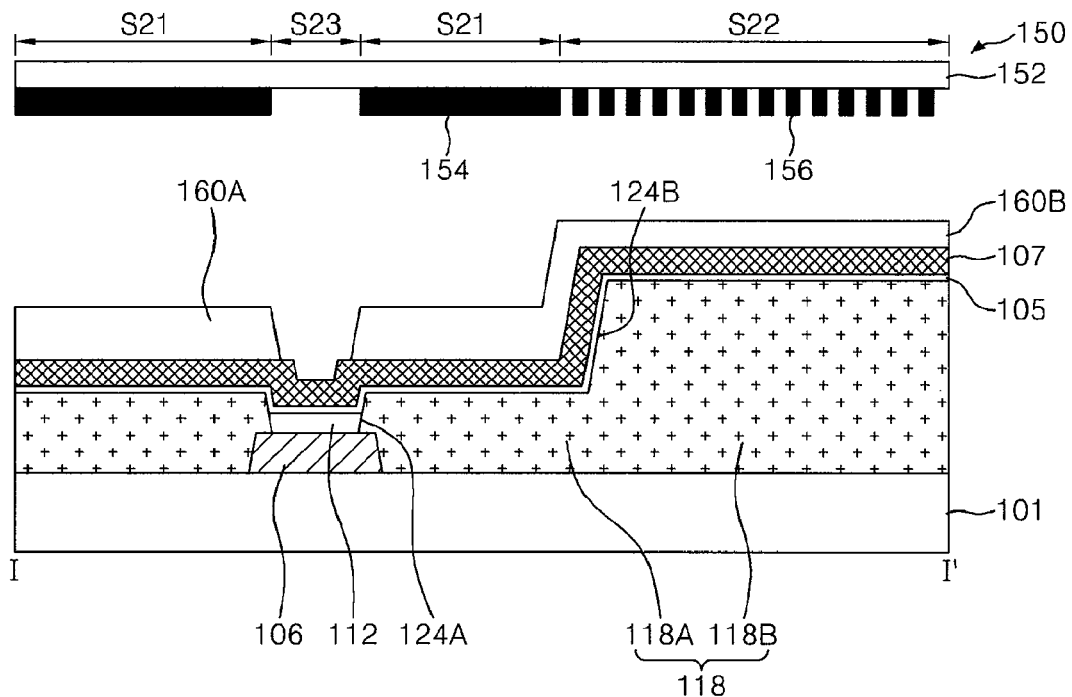
FIGS. 7A to 7E are cross-sectional views for explaining in detail a process of fabricating the source/drain metal pattern, the pixel electrode, the organic semiconductor layer and the passivation layer illustrated in FIG. 6B.

As illustrated in FIG. 7A, the first and second conductive layers 105 and 107 are deposited by a deposition method such as sputtering on the lower substrate 101 on which the organic gate insulating layer 112 is formed. The first conductive layer 105 uses a transparent conductive material such as ITO, TO, IZO and ITZO. The second conductive layer 107 is formed in a single layer structure of a metal material such as Mo, Ti, Cu, AlNd, Al, Cr, Mo alloy, Cu alloy and Al alloy, or in a multi-layer structure deposited by a double layer or more layers using these metals.

Figure 7B:
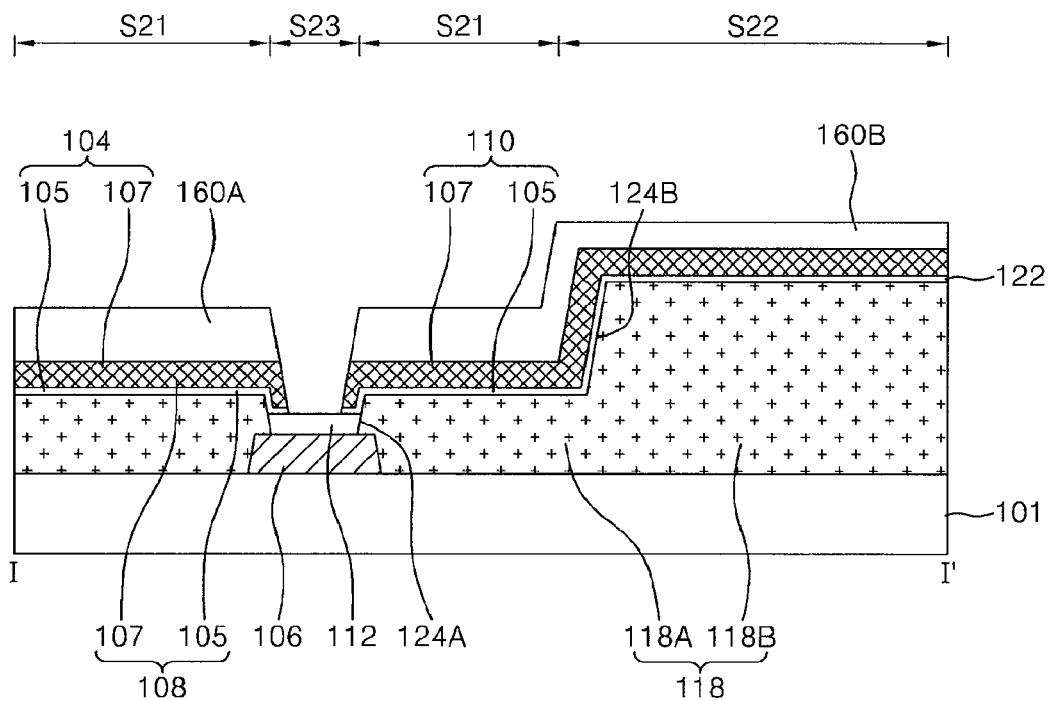

Next, a photoresist is deposited on the second conductive layer 107 and then the photoresist is exposed and developed by a photolithography process using a semi-transmission mask or a slit mask 150, thereby forming first and second photoresist patterns 160A and 160B having a different thickness as illustrated in FIG. 7B.

The slit mask 150 includes an opaque region S21 in which an opaque layer 154 is formed on a quartz substrate 152, a slit region S22 in which a plurality of slits 156 is formed on the quartz substrate 152, and a transmission region S23 in which only the quartz substrate 152 exists. The opaque region S21 is positioned in a region where the source and drain electrodes 108 and 110 and the data line 104 are to be formed and cuts off ultraviolet rays during an exposure process. Therefore, the first photoresist pattern 160A remains after the development process as illustrated in FIG. 7B. The slit region S22 is positioned in a region where the pixel electrode 122 is to be formed and diffracts ultraviolet rays during the exposure process. Then, the second photoresist pattern 160B which is thinner than the first photoresist pattern 160A remains after the development process as illustrated in FIG. 7B. The transmission region S23 transmits ultraviolet rays, thereby removing the photoresist after the development process as illustrated in FIG. 7B.

The first and second conductive layers 105 and 107 are patterned by an etching process using the first and second photoresist patterns 160A and 160B, thereby forming a second conductive pattern group including the data line 104, the source electrode 108, the drain electrode 110 and the pixel electrode 122 of a multi-layer structure as illustrated in FIG. 7B.

Figure 7C:
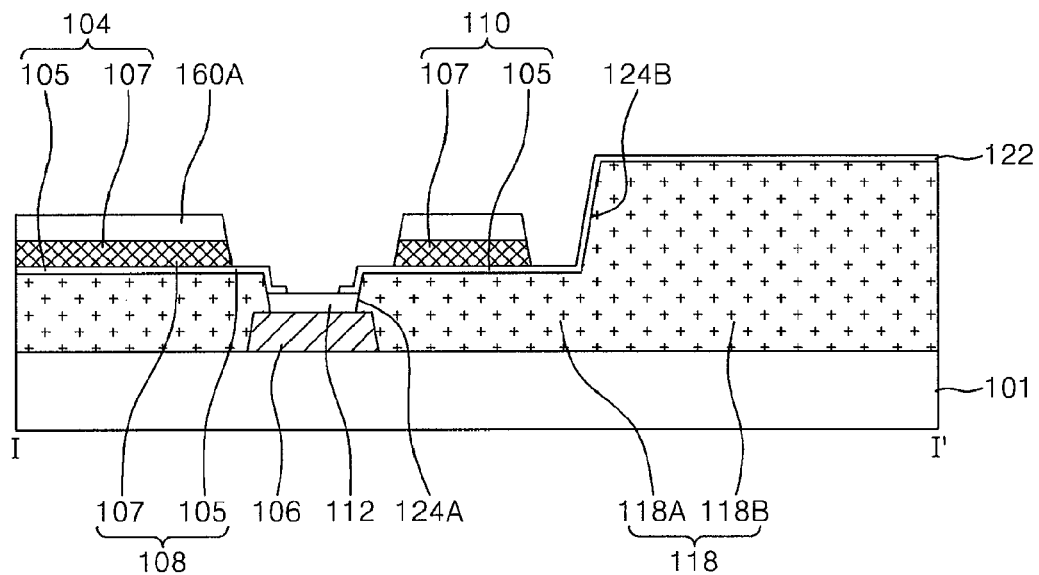

As illustrated in FIG. 7C, the first photoresist pattern 160A becomes thinner by an ashing process using oxygen ($O_2$) plasma and the second photoresist pattern 160B is removed. Next, the second conductive layer 107 on the pixel electrode 122 is removed by an etching process using the ashed first photoresist pattern 106A as a mask. At this time, both sides of the second conductive layer 107 of the source/drain metal pattern are etched once again along the ashed first photoresist pattern 160A. Therefore, the second conductive layer 107 and the first conductive layer 105 of the source/drain metal pattern have a constant step height. The first photoresist pattern 160A remaining on the source/drain metal pattern is removed by a strip process.

Figure 7D:
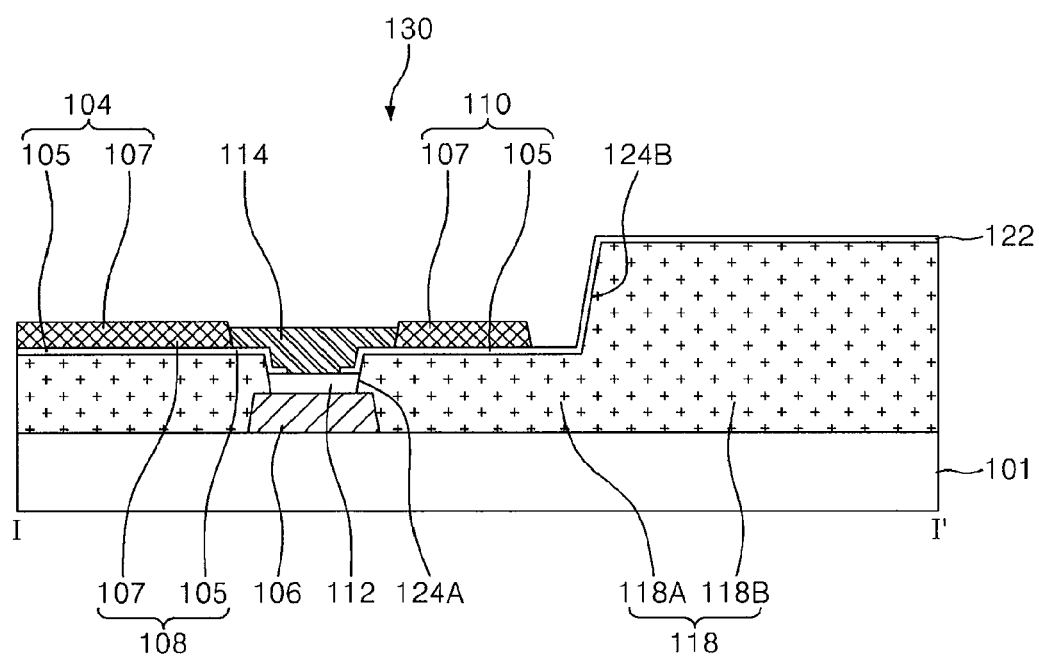

Thereafter, an organic semiconductor of a liquid state is jetted into the source and drain electrodes 108 and 110 and into the dot hole 124A provided by the first bank insulating layer 118A by using an ink-jet device. Next, the organic semiconductor layer 114 of a solid state is formed as illustrated in FIG. 7D by hardening the organic semiconductor of a liquid state. Meanwhile, the lower substrate 101 on which the source/drain metal pattern and the pixel electrode 122 are formed may be surface-processed before the organic semiconductor of a liquid state is jetted. Through the surface processing process, the organic gate-insulating layer 112 has hydrophilicity with the organic semiconductor of a liquid state and the other regions have hydrophobicity with the organic semiconductor. Next, if the organic semiconductor of a liquid state is jetted onto the lower substrate 101, the organic semiconductor of a liquid state is concentrated on the gate insulating layer 112 having hydrophilicity with the organic semiconductor, thereby preventing an overflow phenomenon of the organic semiconductor layer.

After the organic semiconductor layer 114 is formed, it is subject to a SAM process. Then the organic semiconductor layer 114 is in ohmic-contact with the source and drain electrodes 108 and 110.

Figure 7E:
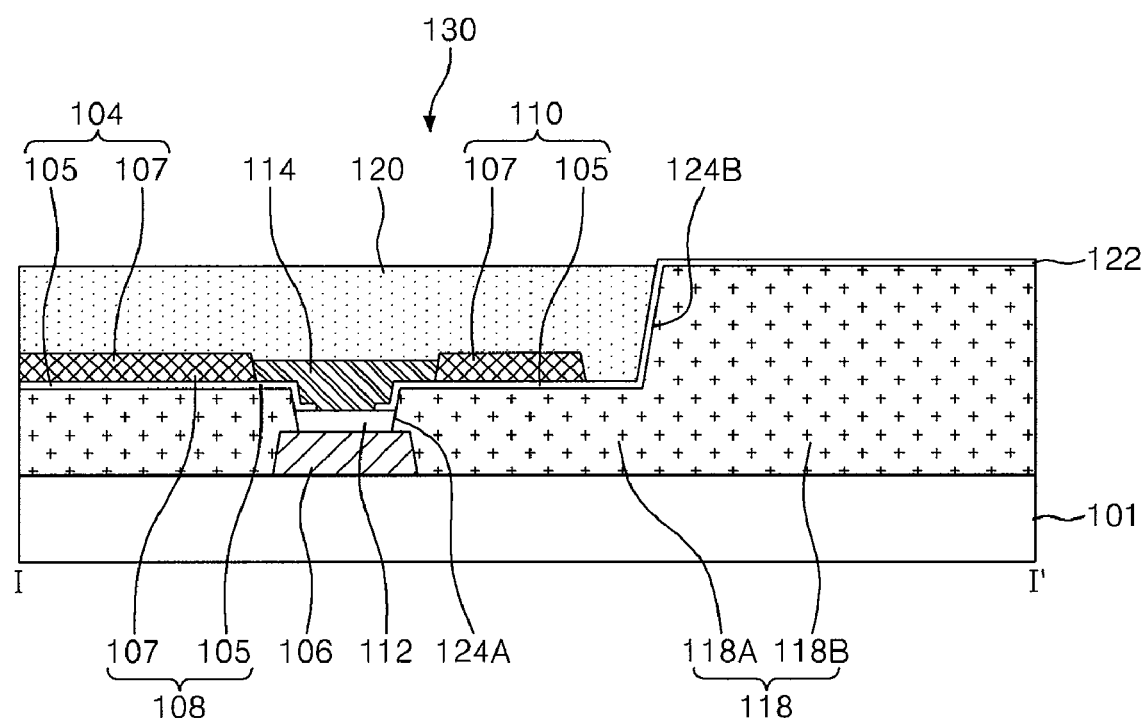

Thereafter, an organic insulating liquid such as polyvinyl alcohol (PVA) is jetted into the line hole 124B provided by the second bank insulating layer 118B by using an ink-jet device, and then hardened. Then, the organic passivation layer 120 is formed within the line hole 124B provided by the second bank insulating layer 118B as illustrated in FIG. 7E.

The lower substrate 101 on which the organic semiconductor layer 114 is formed may be surface-processed before the organic insulating liquid is jetted. Through the surface processing process, regions except the pixel electrode 122 formed on the surface of the second bank layer 118B have hydrophilicity with the organic insulating liquid. If the organic insulating liquid is jetted onto the lower substrate 101, the organic insulating liquid is concentrated on the regions having hydrophilicity with the organic insulating liquid, thereby forming the organic passivation layer 120. The organic passivation layer 120 is prevented from overflowing into regions except the interior of the line hole 124B through the surface processing process.

On the other hand, in the organic TFT and fabrication method therefor according to the present invention, the first bank-insulating layer 118A for providing the dot hole 124A may be formed to have step coverage. Namely, the first bank-insulating layer 118A may be formed to have step coverage so that a region filled with the organic gate-insulating layer 112 and a region filled with the organic semiconductor layer 114 can be separated from each other.

As described above, the organic TFT and fabrication method therefor according to the present invention protect not only the TFT but also peripheral regions of the TFT by the organic passivation layer by forming the organic passivation layer within the line hole provided by the bank-insulating layer along the gate line. Accordingly, damage to the organic semiconductor layer caused by moisture permeating into the boundary between each of the source/drain electrode and the organic semiconductor layer or by chemical liquid necessary for a process can be prevented and the process is simplified because of the increased processing margin of the ink-jet device. In addition, since the bank-insulating layer having the dot hole filled with the organic gate-insulating layer and the organic semiconductor layer and the bank-insulating layer having the line hole filled with the organic passivation layer are formed by a photolithography process using a single mask, the process is simplified.

While the present disclosure of invention has been provided with reference to a certain embodiment, it will be understood by those skilled in the pertinent art and in light of the present disclosure that various changes in form and details may be made therein without departing from the spirit and scope of the present teachings.

What is claimed is:

1. A method of fabricating a thin film transistor substrate, comprising:

forming a gate line and a gate electrode connected to the gate line on a substrate;

forming a bank insulating layer to cover a portion of the gate electrode, the bank insulating layer having a dot hole to expose a remaining portion of the gate electrode and a line hole connected to the dot hole;

forming an gate insulating layer in the dot hole to cover the remaining portion of the gate electrode within the bank insulating layer;

forming on the bank insulating layer a data line intersecting with the gate line, a source electrode connected to the data line, a drain electrode facing the source electrode, and a pixel electrode connected to the drain electrode;

forming an semiconductor layer forming a channel between the source and drain electrodes within the bank insulating layer; and forming a passivation layer to cover the semiconductor layer within the bank insulating layer.

2. The method of claim 1, wherein forming the bank insulating layer includes forming a first bank insulating layer for providing the dot hole and forming a second bank insulating layer determining the position of the passivation layer.

3. The method of claim 1, further comprising surface-processing the gate electrode before forming the gate insulating layer so that the gate electrode can have hydrophilicity with the gate insulating layer.

4. The method of claim 1, wherein the semiconductor layer is at least partially located in the dot hole.

5. The method of claim 1, wherein the passivation layer is parallel to the gate line and is confined to the line hole.

6. The method of claim 1, wherein the dot hole extends down deeper than the line hole.

7. The method of claim 2, wherein forming the bank insulating layer includes:

forming an insulating material on a substrate on which the gate electrode and the gate line are formed;

forming photoresist patterns having a different thickness by a photolithography process using a half-tone mask or a slit mask on the insulating material; and forming the first bank insulating layer having a first thickness and the second bank insulating layer having a second thickness by an etching process using the photoresist patterns.

8. The method of claim 7, wherein forming the data line, the source electrode, the drain electrode and the pixel electrode includes:

sequentially forming a transparent conductive layer and a source/drain metal layer on the substrate;

forming photoresist patterns having a different thickness on the source/drain metal layer;

forming a source/drain metal pattern including the data line and the source and drain electrodes on the first bank insulating layer and forming the pixel electrode on the second bank insulating layer, by patterning the source/drain metal layer and the transparent conductive layer using the photoresist patterns;

exposing the source/drain metal layer of the pixel electrode by ashing the photoresist patterns; and removing the exposed source/drain metal layer.

9. The method of claim 3, further comprising surface-processing the gate insulating layer before forming the semiconductor layer so that the gate insulating layer can have hydrophilicity with the semiconductor layer.

* * * * *